United States Patent [19]

Hillman et al.

[11] Patent Number: 4,966,869
[45] Date of Patent: Oct. 30, 1990

[54] TUNGSTEN DISILICIDE CVD

[75] Inventors: Joseph T. Hillman; J. B. Price, both of Scottsdale; William M. Triggs, Tempe, all of Ariz.

[73] Assignee: Spectrum CVD, Inc., Phoenix, Ariz.

[21] Appl. No.: 519,538

[22] Filed: May 4, 1990

[51] Int. Cl.$^5$ ........................................ H01L 21/443
[52] U.S. Cl. .......................... 437/200; 148/DIG. 147; 437/196
[58] Field of Search ...................... 437/200, 196, 192; 148/DIG. 147

[56] References Cited

U.S. PATENT DOCUMENTS

| | | | |
|---|---|---|---|
| 4,501,769 | 2/1985 | Hieber et al. | 437/200 |
| 4,692,343 | 9/1987 | Price et al. | 427/38 |
| 4,737,474 | 4/1988 | Price et al. | 437/200 |
| 4,902,645 | 2/1990 | Ohba | 148/DIG. 147 |

FOREIGN PATENT DOCUMENTS 62-001228  1/1987  Japan .

Primary Examiner—Brian E. Hearn
Assistant Examiner—Trung Dang
Attorney, Agent, or Firm—Paul F. Wille

[57] ABSTRACT

Tungsten disilicide (WSi$_x$) films are deposited onto doped or undoped polysilicon by reducing WF$_6$ with a mixture of dichlorosilane (SiH$_2$Cl$_2$) and disilane (Si$_2$H$_6$). The addition of disilane provides a mechanism for increasing the resistivity (silicon to tungsten ratio) of the film without adversely affecting the uniformity or deposition rate of the film. A high silicon to tungsten ratio prevents degradation of the silicide film and the underlaying polysilicon film during subsequent growth of an oxide (SiO$_2$) dielectric. The excess silicon in the film also provides desirable etching and annealing characteristics.

4 Claims, 1 Drawing Sheet

TUNGSTEN DISILICIDE CVD

BACKGROUND OF THE INVENTION

The invention relates to the manufacture of semiconductor wafers using chemical vapor deposition (CVD) of tungsten silicide and, in particular, to a process for depositing tungsten silicide by the reduction of tungsten hexafluoride ($WF_6$) by silane gases.

Because of their stability at high temperature, refractory metal silicides, such as tungsten silicide, have received increasing use in the manufacture of semiconductor integrated circuits, e.g. as Schottky barriers, ohmic contacts, or gate metallizations. For the latter application, a low resistivity tungsten silicide layer is formed on a polysilicon layer. Due to the ever decreasing geometry of devices in an integrated circuit, uniformity of the deposition is of great concern. Similarly, deposition rate is of concern since it determines production rates.

Low pressure CVD of tungsten silicide using a mixture of WF6 and monosilane ($SiH_4$) is described in *Solid State Technology* April, 1983, pages 183-185 [1]. Monosilane has a greater tendency to nucleate particles in the gas phase than do the chlorosilanes. The accumulation of silicon within the deposition chamber will eventually fragment, generating particles which can contaminate a wafer. Thus, the use of chlorosilanes, such as dichlorosilane (DCS) ($SiCl_2H_2$) will lead to a cleaner deposition chamber.

Other compounds dissociate less readily, such as silicon tetrachloride ($SiCl_4$), but this causes difficulty in starting the deposition cycle. Intermediate compounds, such as dichlorosilane ($SiH_2Cl_2$), have intermediate characteristics. The use of dichlorosilane instead of silane is described in U.S. Pat. No. 4,692,343 [2]; in *J. Vac. Sci. Technol.* B 6 (6), November—December, 1988, pages 1707-1713 [3]; in *Surface and Interface Analysis*, Vol 14 (1989), pages 13-17 [4]; and in *J. Electrochem. Soc.*, Vol 136, No. 4, April, 1989, pages 1177-1180 [5].

Alternatively, as described in *J. Electrochem. Soc.*, Vol. 134, No. 5, May, 1987, pages 1220-1224 [6], it is known to use disilane ($Si_2H_6$) instead of silane for reducing the $WF_6$. In this article, results from silane and disilane are compared.

In all of these processes, one is confronted with the conflicting requirements of high deposition rate and uniformity of deposition. Improving one while keeping the other constant is desirable, improving both is very difficult.

Further complicating the process, it is difficult to increase the silicon to tungsten ratio without degrading both deposition rate and uniformity. A high silicon to tungsten ratio, i.e. greater than 2:6, prevents degradation of the silicide film in subsequent steps and poor adhesion to the underlying polysilicon film. A silicon to tungsten ratio greater than 2.6:1 is desirable to suppress oxidation of the tungsten in the silicide film and to control consumption of the underlying polysilicon film during formation of the $SiO_2$ dielectric. The excess silicon in the silicide film also reduces film stress and provides for more desirable etching characteristics. In the prior art, the ratio could be increased only by decreasing the partial pressure of the $WF_6$ (or increasing the partial pressure of $SiH_4/SiH_2Cl_2/Si_2H_6$). This leads to lower deposition rate and worse uniformity.

One technique for modifying the silicon to tungsten ratio is to deposit a thin layer of silicon prior to depositing the silicide, as described in U.S. Pat. No. 4,737,474. While this provides greater adhesion, it does not modify the silicon content of the bulk of the silicide layer.

In view of the foregoing, it is therefore an object of the present invention to provide an improved process for depositing silicide by the chemical reduction of $WF_6$.

Another object of the present invention is to provide a process for controlling the silicon to tungsten ratio independently of deposition rate and uniformity.

A further object of the present invention is to provide a silicon to tungsten ratio of 2.6:1 or greater.

SUMMARY OF THE INVENTION

The foregoing objects are achieved in the present invention wherein the silicon to tungsten ratio in a tungsten silicide film can be significantly increased by adding less than ten percent disilane ($Si_2H_6$) to the gas mixture of $WF_6$ and $SiH_2Cl_2$; i.e. disilane is added to the mixture rather than replacing another gas, as in the prior art. As more fully described herein, it has been discovered that this addition provides significantly improved and unexpected results.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
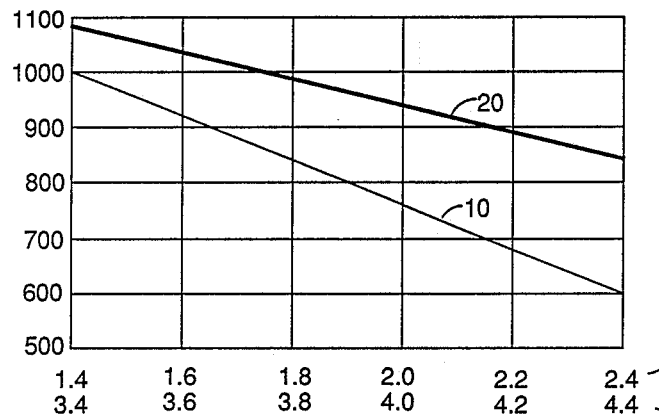
FIG. 1 illustrates the present invention in terms of the effect of the flow of $WF_6$ on film resistivity.
Figure 2:
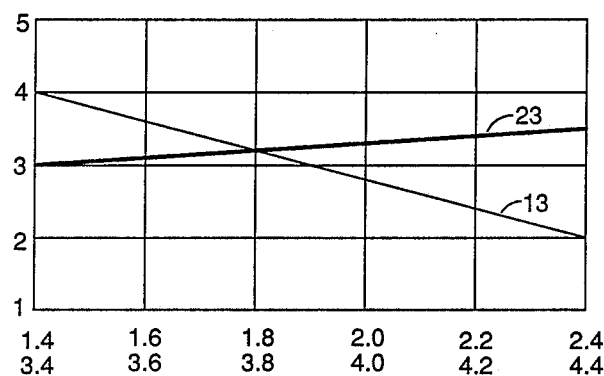
FIG. 2 illustrates the present invention in terms of the effect of the flow of $WF_6$ on film uniformity.
Figure 3:
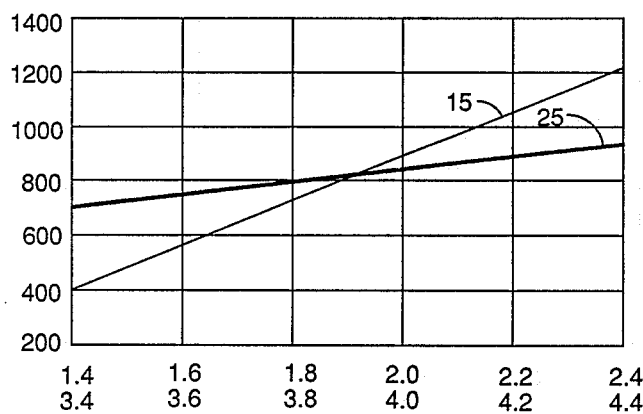
FIG. 3 illustrates the present invention in terms of the effect of the flow of $WF_6$ on film deposition rate.

In FIGS. 1-3, the abscissa represents the rate of flow of $WF_6$ in SCCM. Value labels 11 and 12 indicate the $WF_6$ flow without and with disilane, respectively. The ordinate in FIG. 1 represents resistivity. Line 10 indicates the result of using a combination of $SiH_2Cl_2$ and $WF_6$ only. Line 20 indicates the result of adding disilane to the mixture. Clearly, adding disilane reduces the effect of increasing the flow of $WF_6$.

In FIG. 2, the ordinate represents uniformity, expressed as a percent. Line 13 shows the typical relationship obtained in the prior ar without the addition of disilane. Line 23 shows the effect of adding disilane. Unexpectedly and unpredictably, the slope of the line is reversed from that of line 13.

In accordance with the present invention, one can increase the resistivity by adding disilane without affecting deposition rate or uniformity. Further, as indicated by FIGS. 1 and 2, one now has the choice of reducing $WF_6$ to further increase resistivity. By adding disilane, one not only obtains an increase in resistivity, but uniformity improves also.

The increase in resistivity (Si:W ratio) is not without limit. For reasons unrelated to the present invention, one wants a resistivity before annealing of 800-1200 $\mu\Omega$-cm. Thus, the combination of flow, pressure, temperature, etc. is chosen so that the resistivity stays within these limits. As discussed in the Background of the Invention, it was difficult to achieve a resistivity much above 850 $\mu\Omega$-cm. with good uniformity and high deposition rate using processes of the prior art. With the present invention, that difficulty is removed. This does not mean that the resistivity should increase as much as possible. It means that the wafer manufacturer has a much easier time defining a process since a former compromise need no longer be made.

In FIG. 3, line 15 indicates a typical result without the use of disilane. Line 25 indicates the result of adding disilane to the mixture of $WF_6$ and $SiH_2Cl_2$. As seen from the respective slopes of the lines, adding disilane in accordance with the present invention reduces the effect of increasing $WF_6$ flow.

The following example is a preferred embodiment of the deposition process in accordance with the present invention. This and the other examples were performed in a reactor similar to that described in the above-identified patents and in reference [3].

| EXAMPLE 1 | |
| --- | --- |
| Wafer temperature | 560° C. |
| $SiH_2Cl_2$ par. press. | 82 mtorr |
| $WF_6$ par. press. | 4 mtorr |
| $Si_2H_6$ par. press. | 4 mtorr |
| Pressure | 90 mtorr |
| Deposition rate | 1300 A°/min. |
| Resistivity | 900 $\mu\Omega$-cm. |
| Si:W ratio | 2.7 |
| Uniformity | 3% |

Films produced as above were annealed at a temperature of 1050° C. for 180 seconds. The resistivity dropped to 60 $\mu\Omega$-cm. Films which were oxidized showed very uniform $SiO_2$ growth without oxidation of tungsten.

As another example of the present invention, the following produced satisfactory results.

| EXAMPLE 2 | |
| --- | --- |
| Wafer temperature | 500° C. |
| $SiH_2Cl_2$ par. press. | 84 mtorr |
| $WF_6$ par. press. | 4 mtorr |
| $Si_2H_6$ par. press. | 2 mtorr |
| Pressure | 90 mtorr |
| Deposition rate | 1080 A°/min. |
| Resistivity | 923 $\mu\Omega$-cm. |
| Si:W ratio | 2.8 |
| Uniformity | 3.4% |

In the following examples, the partial pressure of $Si_2H_6$ is varied. For all these examples, the wafer temperature is 560° C. and the pressure is 90 mtorr.

| EXAMPLE | 3 | 4 | 5 | 6 | |
| --- | --- | --- | --- | --- | --- |
| $SiH_2Cl_2$ par. press. | 87.3 | 86.6 | 85.2 | 82.5 | mtorr |
| $WF_6$ par. press. | 1.9 | 1.9 | 1.8 | 1.8 | mtorr |
| $Si_2H_6$ par. press. | .8 | 1.5 | 3.0 | 5.7 | mtorr |
| Deposition rate | 1334 | 1309 | 1190 | 1141 | A°/min. |
| Resistivity | 769 | 823 | 943 | 1255 | $\mu\Omega$-cm. |
| Si:W ratio | 2.6 | 2.6 | 2.8 | 3.2 | |
| Uniformity | 3.35 | 3.71 | 7.39 | 6.80% | |

In general, adding less than ten percent disilane produces acceptable results. While the deposition rate decreases, the decrease is much less pronounced that would be obtained from decreasing the relative amount of $WF_6$ to obtain the same increase in resistivity (and silicon to tungsten ratio).

In the following examples, processes with and without $Si_2H_6$ are compared. This is a portion of the data used to generate FIGS. 1–3, described above. For these two examples, the wafer temperature is 560° C. and the pressure is 90 mtorr.

| EXAMPLE | 7 | 8 | |
| --- | --- | --- | --- |
| $SiH_2Cl_2$ par. press. | 88.6 | 84.4 | mtorr |
| $WF_6$ par. press. | 1.4 | 2.8 | mtorr |
| $Si_2H_6$ par. press. | 0 | 2.8 | mtorr |
| Deposition rate | 1300 | 1300 | A°/min. |
| Resistivity | 800 | 900 | $\mu\Omega$-cm. |
| Si:W ratio | 2.6 | 2.8 | |
| Uniformity | 3 | 3% | |

Note that the deposition rate and uniformity are unchanged, yet the resistivity (and silicon to tungsten ratio) increase with the addition of disilane. This was not expected.

There is thus provided by the present invention an improved process for depositing tungsten silicide having a silicon to tungsten ratio of 2.6:1 or greater, wherein said ratio is controllable relatively independently of deposition rate and uniformity.

Having thus described the invention, it will be apparent to those of skill in the art that various modifications can be made within the scope of the present invention. For example, wafer temperature can vary from 450° C. to 650° C., the higher temperatures increasing deposition rate. Suitable pressures are from 30 to 300 mtorr. The partial pressure of dichlorosilane can vary from 27 to 285 mtorr, with corresponding adjustments in the partial pressures of $WF_6$ and disilane. The amount of disilane added can comprise up to ten percent of the gas mixture. Thus, as previously indicated, one now has the ability to modify other parameters over a wider range without sacrificing resistivity.

We claim:

1. In a method for depositing a tungsten disilicide layer on a wafer heated to a temperature above 450° C. in a chamber through which a gas mixture of $WF_6$ and $SiH_2Cl_2$ flows, the improvement comprising the step of:
    adding less than ten percent disilane to said gas mixture.

2. A process for depositing a tungsten silicide layer on a semiconductor wafer in a reaction chamber comprising the steps of:
    supplying a gas mixture of dichlorosilane, tungsten hexafluoride, and disilane to said chamber, wherein said disilane comprises less than ten percent of said mixture;
    maintaining the pressure in said chamber between 30 and 300 mtorr; and
    heating the wafer to a temperature of from 450° C. to 650° C. to deposit said tungsten silicide layer.

3. The process as set forth in claim 2 wherein the partial pressure of dichlorosilane is from 27 to 285 mtorr.

4. The process as set forth in claim 2 wherein said wafer is heated to a temperature of approximately 560° C., the partial pressure of dichlorosilane is approximately 82 mtorr, the partial pressure of tungsten hexafluoride is approximately 4 mtorr, and the partial pressure of disilane is approximately 4 mtorr.

* * * * *